(12) United States Patent
Goto

(10) Patent No.: US 7,116,123 B2
(45) Date of Patent: Oct. 3, 2006

(54) CONTACT PROBE, PROBE SOCKET, ELECTRICAL CHARACTERISTIC MEASURING DEVICE, AND METHOD FOR PUSHING THE CONTACT PROBE AGAINST OBJECT TO BE MEASURED

(75) Inventor: Akifumi Goto, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/859,282

(22) Filed: Jun. 2, 2004

(65) Prior Publication Data

US 2004/0246014 A1    Dec. 9, 2004

(30) Foreign Application Priority Data

Jun. 9, 2003    (JP) .............................. 2003-163637

(51) Int. Cl.
*G01R 31/02*    (2006.01)
(52) U.S. Cl. .................................................. 324/761
(58) Field of Classification Search ............... None
See application file for complete search history.

(56) References Cited

U.S. PATENT DOCUMENTS

| | | | | |
|---|---|---|---|---|
| 3,584,300 A | * | 6/1971 | Schulz et al. ................ 324/761 |
| 3,904,960 A | * | 9/1975 | Niehaus ....................... 324/696 |
| 4,004,843 A | * | 1/1977 | Boenning et al. ............. 439/86 |
| 4,490,593 A | * | 12/1984 | Cook ........................... 218/152 |
| 4,659,987 A | * | 4/1987 | Coe et al. .................... 324/754 |
| 4,889,483 A | * | 12/1989 | Gentry ......................... 432/49 |
| 4,918,384 A | * | 4/1990 | Giringer et al. ............. 324/761 |
| 4,926,119 A | * | 5/1990 | Prokopp ...................... 324/761 |
| 4,959,609 A | * | 9/1990 | Prokopp et al. ............. 324/537 |
| 5,029,038 A | * | 7/1991 | Covi et al. ................... 361/58 |
| 5,084,673 A | * | 1/1992 | Kazama ....................... 324/761 |
| 5,124,646 A | * | 6/1992 | Shiraishi ...................... 324/761 |
| 5,189,364 A | * | 2/1993 | Kazama ....................... 324/761 |
| 2004/0246014 A1 | * | 12/2004 | Goto ........................... 324/761 |

FOREIGN PATENT DOCUMENTS

| | | |
|---|---|---|
| EP | 290182 A1 * | 11/1988 |
| JP | 07012846 | 1/1995 |
| JP | 09072932 | 3/1997 |
| JP | 2001-201515 | 7/2001 |

* cited by examiner

*Primary Examiner*—Paresh Patel
(74) *Attorney, Agent, or Firm*—Brinks Hofer Gilson & Lione

(57) ABSTRACT

A contact probe includes a probe tip and a damper. The probe tip includes a first barrel, a probe pin, and a first spring. The first barrel has a cavity with a bottom, an opening being disposed in a first end of the first barrel and the bottom being disposed at a second end of the first barrel. The probe pin is mounted in the first barrel so as to be movable forward and backward. The first spring is mounted in the cavity for elastically biasing the probe pin towards the opening. The damper is mounted to the second end of the first barrel, and elastically supports the first barrel.

19 Claims, 15 Drawing Sheets

CONTACT PROBE, PROBE SOCKET, ELECTRICAL CHARACTERISTIC MEASURING DEVICE, AND METHOD FOR PUSHING THE CONTACT PROBE AGAINST OBJECT TO BE MEASURED

This application claims the benefit of Japanese Patent Application No. 2003-163637, filed on Jun. 9, 2003, which is incorporated herein by reference.

BACKGROUND OF THE INVENTION

1. Field of the Invention

Aspects of the present invention relate to a contact probe, a probe socket, an electrical characteristic measuring device, and a method for pushing the contact probe against an object to be measured. More particularly, an aspect of the present invention relates to a technology which makes it possible to mitigate electrostatic discharge damage or mechanical damage to an electronic device when measuring electrical characteristics of the electronic device.

2. Description of the Related Art

As shown in FIG. 14, a related electrical characteristic measuring device, such as a digital multimeter, comprises a body 61 incorporating an electrical measuring unit, a measurement cable 62 drawn out from the body 61, and a probe socket 63 connected to the measurement cable 62. In the example shown in FIG. 14, the probe socket 63 has two contact probes 64 and 64. By pushing the contact probes 64 and 64 against, for example, terminals $T_1$ and $T_2$ of a thin-film magnetic head H (object to be measured), an electrical characteristic between the terminals $T_1$ and $T_2$ can be measured.

In the related electrical characteristic measuring device shown in FIG. 14, the measurement cable 62 may accumulate electrical charge because it has an insulating film, and the contact probes 64 are in an easily chargeable state because they are in electrically floated states from a power source ground of the body 61. When the measurement cable 62 or the contact probes 64 are charged, and the contact probes 64 and 64 contact the terminals $T_1$ and $T_2$ of the thin-film magnetic head H, an electrical charge Q moves momentarily. Even if the electrical charge Q that moves momentarily is a small amount, a current value, which is a time differential of the electrical charge Q, is increased. The flow of a large amount of current causes electrostatic discharge damage to the thin-film magnetic head H.

Contact probes having barrel structures are disclosed as means for preventing electrostatic discharge damage in, for example, Japanese Unexamined Patent Application Publication No. 2001-201515. Probes having the same structures as the contact probes disclosed in Japanese Unexamined Patent Application Publication No. 2001-201515 is shown in FIG. 15. As shown in FIG. 15, contact probes 200 and 200 have respective probe pins 201 and 201 and respective springs 202 and 202 disposed in respective barrels 203 and 203. The probe pins 201 and 201 are biased towards respective ends 203a and 203a of the barrels by the respective springs 202 and 202. Ends of the probe pins 201 and 201 protrude from the respective barrels 203 and 203. The probe pins 201 and 201 are formed of high-resistance materials, and the barrels 203 and 203 are formed of low-resistance materials.

When the above-described contact probes are pushed against the respective terminals $T_1$ and $T_2$ of the thin-film magnetic head H, first, ends of the probe pins 201 and 201 come into contact with the respective terminals $T_1$ and $T_2$ Of the thin-film magnetic head. Then, the probe pins 201 and 201 push and compress the springs 202 and 202, and are pushed into the respective barrels 203 and 203. At the same time that the probe pins 201 and 201 are pushed into the respective barrels 203 and 203, the ends 203a and 203a of the respective barrels come into contact with the respective terminals $T_1$ and $T_2$. As a result of the barrels 203 and 203 coming into contact with the respective terminals $T_1$ and $T_2$, an electrical circuit is formed between the thin-film magnetic head H and the electrical characteristic measuring device, and an electrical characteristic between the terminals $T_1$ and $T_2$ of the thin-film magnetic head H is measured.

When the ends of the respective probe pins 201 and 201 contact the respective terminals $T_1$ and $T_2$ of the thin-film magnetic head, electrical charges flow between the thin-film magnetic head H and the probe pins 201 and 201. Since the probe pins 201 and 201 are formed of high-resistance materials, the electrical current value at this time is low. Accordingly, since the electrical charges flow with a small current value, and are removed before the barrels 203 and 203 come into contact with their respective terminals $T_1$ and $T_2$, it is possible to prevent electrostatic discharge damage.

However, since the contact probes disclosed in Japanese Unexamined Patent Application Publication No. 2001-201515 are directly mounted to the probe socket, they are formed so that force applied to the probe socket is directly applied to the contact probes. Therefore, when the probe socket is strongly pushed against the terminals of the thin-film magnetic head, the ends of the barrels strongly contact the terminal surfaces, thereby producing contact pressure which may damage the terminal surfaces.

In addition, as shown in FIG. 15, the positions of terminal surfaces $T_{11}$ and $T_{22}$ of the thin-film magnetic head may not be aligned because of stacking of dimensional tolerance at the time of manufacture. When one tries to measure electrical characteristics by pushing the probe socket 63 against the non-aligned terminals $T_1$ and $T_2$, and the barrel end 203a of one of the contact probes 200 contacts the terminal surface $T_{11}$, only the probe pin 201 of the other contact probe 200 may be in contact with the terminal surface $T_{22}$. In this case, the probe pin 201 having high resistance is interposed in a measurement circuit system, thereby preventing precise measurements of the electrical characteristics.

SUMMARY OF THE INVENTION

An aspect of the present invention to provides a contact probe which makes it possible to measure electrical characteristics while preventing electrostatic discharge damage to an object to be measured, a probe socket, an electrical characteristic measuring device, and a method for pushing the contact probe against the object to be measured.

According to an aspect of the present invention, a contact probe is provided comprising a probe tip and a damper. The probe tip comprises a first barrel, a probe pin, and a first spring. The first barrel has a cavity with a bottom, an opening being disposed in a first end of the first barrel and the bottom being disposed at a second end of the first barrel. The probe pin is movable forward and backward in the cavity. The first spring is mounted in the cavity such that it elastically biases the probe pin towards the opening. The damper is mounted to the second end of the first barrel, and elastically supports the first barrel. Contact pressure produced when the first end of the first barrel contacts an object to be measured is reduced by the damper.

The contact probe may be such that the damper comprises a second barrel, a plunger, and a second spring. The second barrel has a cavity with a bottom, an opening being disposed in a first end of the second barrel and the bottom being disposed at a second end of the second barrel. The plunger is mounted in the second barrel so as to be movable forward and backward, and is connected to the second end of the first barrel. The second spring is mounted in the second barrel for elastically biasing the plunger towards the opening of the second barrel. It may be desirable that the forward and backward movement directions of the plunger and those of the probe pin be the same.

The first barrel may be elastically supported by the second spring through the plunger, so that contact pressure of the first barrel can be reduced by the second spring. In addition, making the forward and backward movement directions of the plunger and those of the probe pin the same may make it possible to reduce the contact pressure of the first barrel.

The contact probe may be such that the damper comprises a second barrel, a plunger, and a second spring. The second barrel has a cavity with a bottom, an opening being disposed in a first end of the second barrel and the bottom being disposed at a second end of the second barrel. The plunger is mounted in the second barrel so as to be movable forward and backward. The second spring is mounted in the second barrel for elastically biasing the plunger towards the opening of the second barrel. The second end of the second barrel is connected to the second end of the first barrel.

The first barrel may be elastically supported by the second spring through the second barrel, so that contact pressure of the first barrel can be reduced by the second spring. In a further aspect, integrally forming the first and second barrels makes it possible to reduce the number of components of the contact probe.

In a contact probe according to an embodiment of the present invention, the spring constant of the second spring may be greater than the spring constant of the first spring. When the contact probe is pushed against an object to be measured, the first spring is more easily compressed than the second spring is compressed. When the first spring is compressed, the first end of the first barrel comes into contact with the object subsequent to the contacting of the probe pin. Then, the second spring is compressed, and the damper operates. Therefore, may be possible to reliably bring the first barrel into contact with the object, so that electrical characteristics can be measured.

In a contact probe according to an embodiment of the present invention, the sheet resistivity of the probe pin may be greater than the sheet resistivity of the first barrel. Since the sheet resistivity of the probe pin is greater than that of the barrel, the electrical charges at an object to be measured and the contact probe itself may move slowly through the probe pin, so that the current value resulting from the electrical charges can be kept low. Therefore, may be possible to mitigate electrostatic discharge damage to the object caused by contact of the contact probe.

In a contact probe according to an embodiment of the present invention, an end of the probe pin may be spherical. By virtue of the structure, an object to be measured will not be scratched by contact of the probe pin.

According to another aspect of the present invention, there is provided a probe socket comprising a plurality of any one of the above-described contact probes. In the probe socket, the forward movement directions of the contact pins of the contact probes may be the same and the backward movement directions of the contact pins of the contact probes may be the same, and the first ends of the first barrels may be aligned. Since the ends of the first barrels contact an object to be measured at the approximately same time, electrical characteristics can be measured effectively.

In a circumstance where the measurement surfaces of the object to be measured are not aligned, and only the first barrels of some of the contact probes are in contact with respective measurement surfaces of the object (so that the first barrels of the other contact probes are not in contact with respective measurement surfaces of the object), the dampers of the contact probes whose first barrels are in contact may operate to reduce the overall length of the contact probes themselves by the action of further pushing the probe socket against the object. Accordingly, the first springs of the contact probes whose first barrels are not in contact are compressed, so that the first barrels can be brought into contact with the respective measurement surfaces of the object. Therefore, it is possible to bring the first barrels of all contact probes into contact with the object, so that electrical characteristics can be measured precisely.

According to a yet another aspect of the present invention, there is provided an electrical characteristic measuring device comprising any one of the above-described contact probes, or the above-described probe socket.

According to a still another aspect of the present invention, there is provided a method for pushing a contact probe against a terminal of an electronic device. The method comprises the steps of bringing an end of a probe pin into contact with the terminal, bringing a first end of a first barrel into contact with the terminal while compressing a first spring, and operating a damper. The contact probe comprises a probe tip and the damper. The probe tip comprises the first barrel, the probe pin, and the first spring. The first barrel has a cavity with a bottom, an opening being disposed in the first end of the first barrel and the bottom being disposed at a second end of the first barrel. The probe pin is movable forward and backward in the cavity. The first spring is mounted in the cavity for elastically biasing the probe pin towards the opening. The damper is mounted to the second end of the first barrel, and elastically supports the first barrel.

According to a method of the present invention, the damper may comprise a second barrel, a plunger, and a second spring. The second barrel has a cavity with a bottom, an opening may be disposed in a first end of the second barrel and the bottom is disposed at a second end of the second barrel, the plunger may be mounted in the second barrel so as to be movable forward and backward, and the second spring is mounted in the second barrel for elastically biasing the plunger towards the opening of the second barrel. In addition, the step of operating the damper may comprise compressing the second spring and biasing the plunger towards the second end of the second barrel.

According to the above-described method, when the contact probe is pushed against an object to be measured, the first spring is more easily compressed than the second spring is compressed. Then, the first end of the first barrel comes into contact with the object subsequent to the contacting of the probe pin. Then, the second spring is compressed, and the damper operates. Therefore, it is possible to reliably bring the first barrel into contact with the object, so that electrical characteristics can be measured.

DESCRIPTION OF THE PREFERRED EMBODIMENTS

Figure 1:
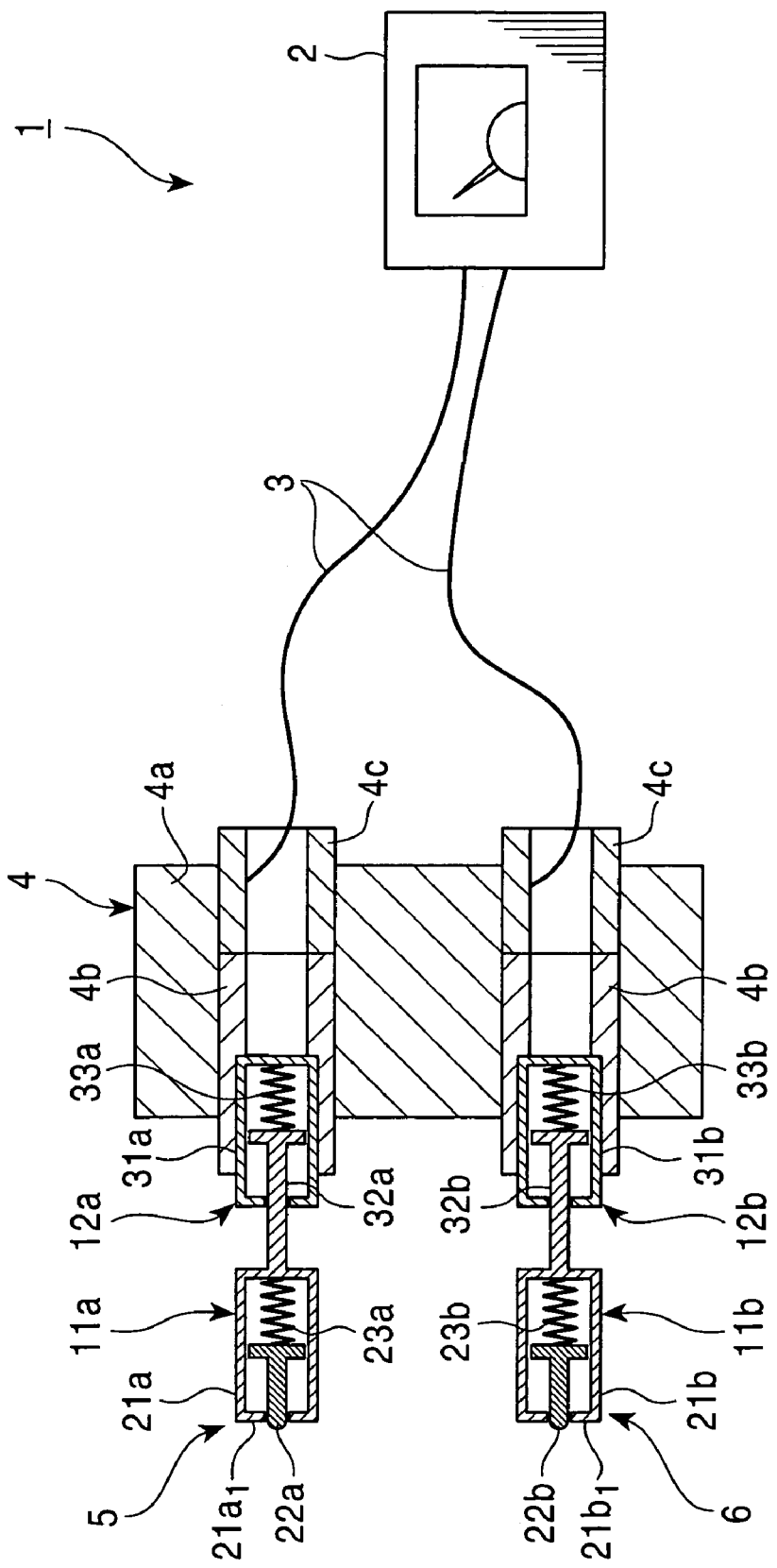
FIG. 1 is a schematic view of the structure of an electrical characteristic measuring device of a first embodiment.
Figure 2:
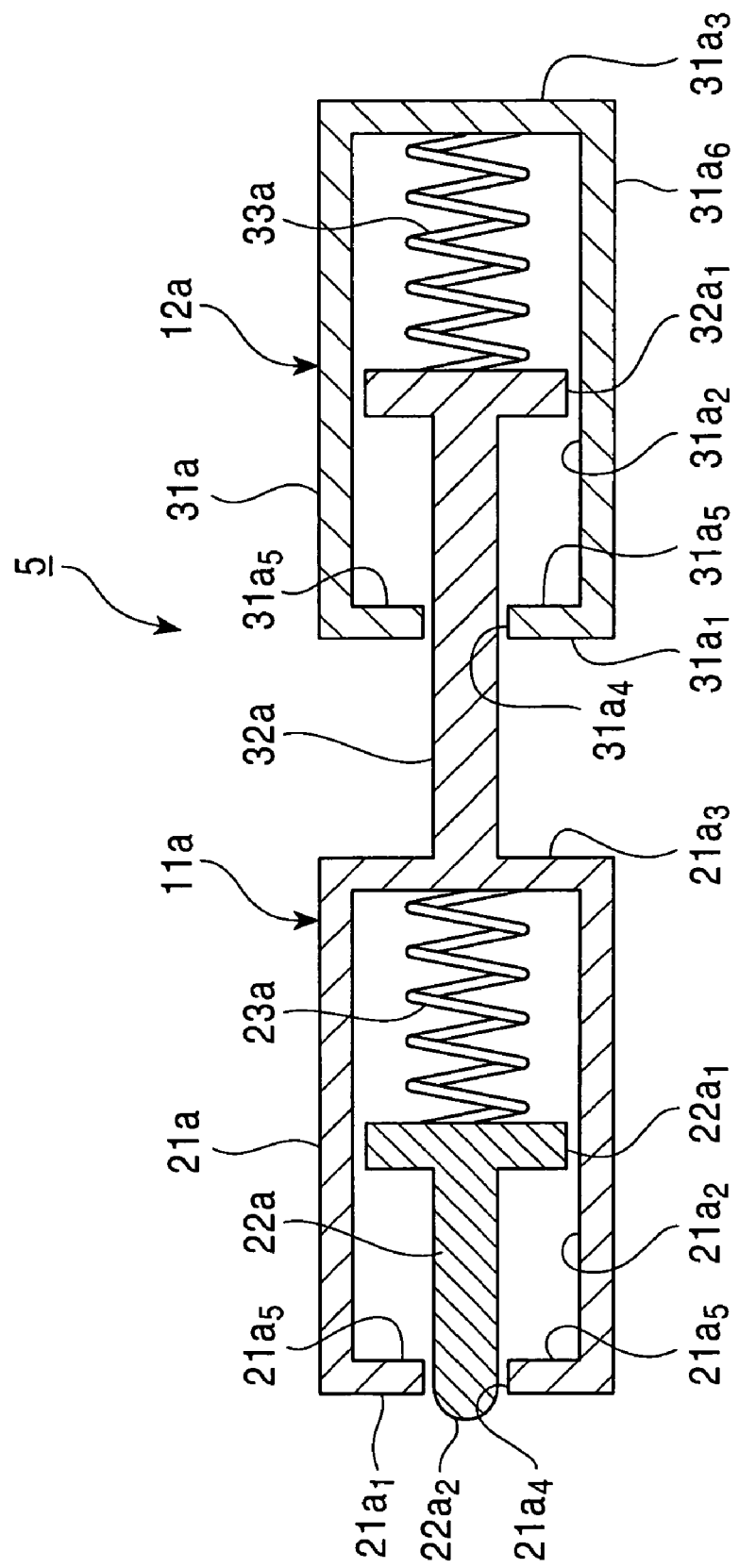
FIG. 2 is a sectional schematic view of the structure of a contact probe of the electrical characteristic measuring device of the first embodiment.
Figure 3:
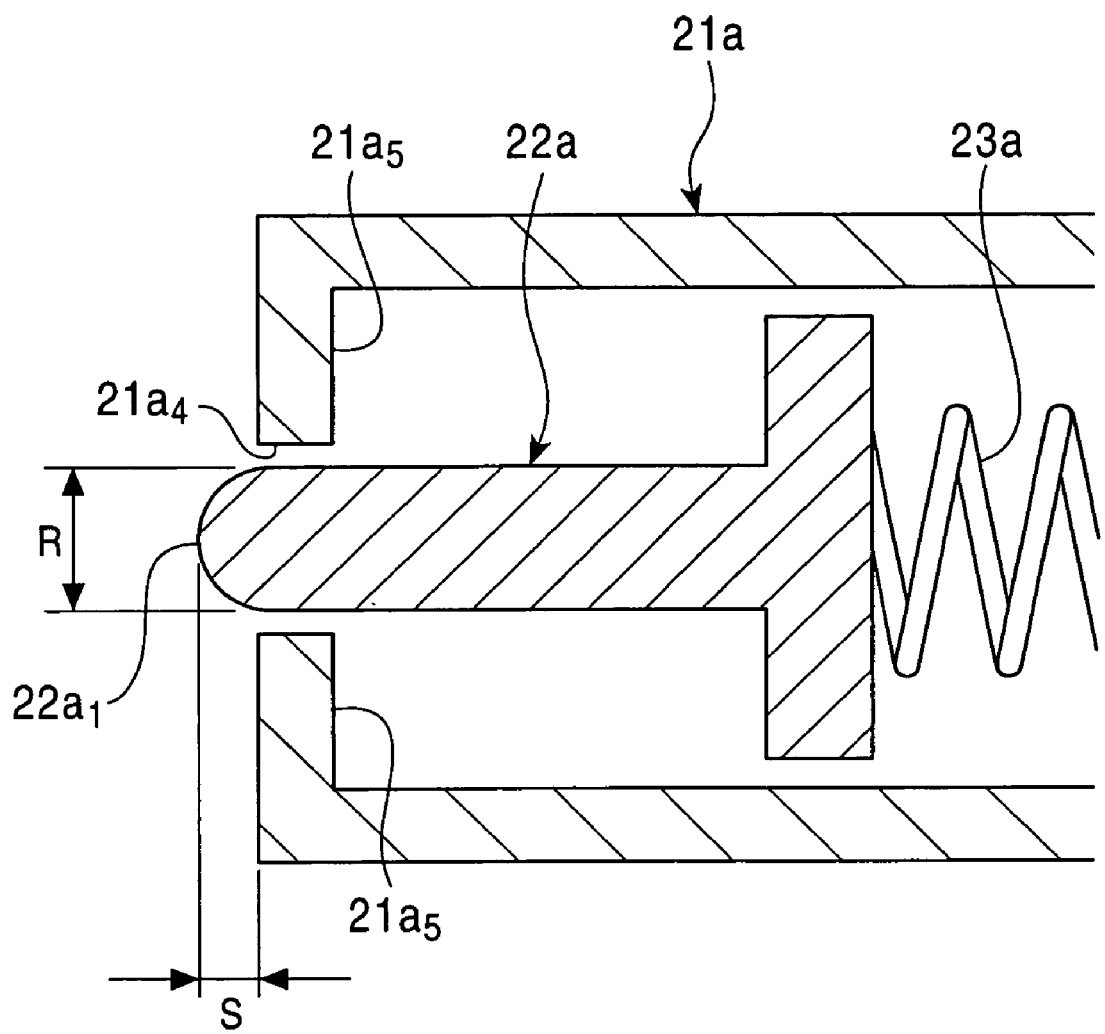
FIG. 3 is a sectional schematic view of the main portion of the contact probe shown in FIG. 2.

Several embodiments of the present invention will be described with reference to the relevant drawings. FIG. 1 shows the structure of an electrical characteristic measuring device of a first embodiment. FIG. 2 shows the structure of a contact probe of the electrical characteristic measuring device shown in FIG. 1. FIG. 3 is a sectional view of the main portion of the contact probe.

As shown in FIG. 1, an electrical characteristic measuring device 1 of a first embodiment comprises a body 2 incorporating an electrical measuring unit, a measurement cable 3 drawn out from the body 2, and a probe socket 4 connected to the measurement cable 3. In the example shown in FIG. 1, the probe socket 4 has two contact probes 5 and 6. By pushing the contact probes 5 and 6 against, for example, terminals of a thin-film magnetic head (as an example of the object whose characteristics are to be measured), electrical characteristics between the terminals can be measured.

The contact probes 5 and 6 have equivalent structures, so that the contact probe 5 is only shown in FIG. 2. As shown in FIGS. 1 and 2, the contact probes 5 and 6 comprise probe tips 11a and 11b and dampers 12a and 12b, respectively. The probe tips 11a and 11b comprise, respectively, first barrels 21a and 21b, probe pins 22a and 22b movable forward and backward in the respective first barrels 21a and 21b, and first springs 23a and 23b for elastically biasing the respective probe pins 22a and 22b. The dampers 12a and 12b comprise, respectively, second barrels 31a and 31b, plungers 32a and 32b movable forward and backward in the respective second barrels 31a and 31b, and second springs 33a and 33b for elastically biasing the respective plungers 32a and 32b.

As shown in FIG. 1, the probe socket 4 may comprise the two contact probes 5 and 6 and a body 4a for holding the contact probes 5 and 6. The body 4a has two socket portions 4b and 4b in which the second barrels 31a and 31b of the respective contact probes 5 and 6 are inserted. Probe terminals 4c and 4c are connected to the respective socket portions 4b and 4b, and the contact probes 5 and 6 are connected to the respective measurement cables 3 and 3 through the respective probe terminals 4c and 4c.

The contact probes 5 and 6 are aligned so that the forward and backward movement directions of the probe pin 22a and those of the probe pin 22b are the same with respect to the body 4a, and so that first ends $21a_1$ and $21b_1$ of the respective first barrels 21a and 21b are aligned with respect to the body 4a.

As shown in FIG. 2, the probe tip 11a comprises the first barrel 21a, the probe pin 22a, and the first spring 23a. The first barrel 21a has a cavity $21a_2$ having a bottom. The cavity $21a_2$ is formed so that the bottom is formed at a second end $21a_3$ of the first barrel 21a, and communicates with an opening $21a_4$ in the first end $21a_1$ of the first barrel. A stopper $21a_5$ is disposed at the first end $21a_1$ of the first barrel 21a.

The probe pin 22a is accommodated in the cavity $21a_2$ of the first barrel 21a, and is thinner than the opening $21a_4$. An engager $22a_1$ is formed at a base end of the probe pin 22a, and is stopped by the stopper $21a_5$ as a result of engaging it with the stopper $21a_5$. An end $22a_2$ of the probe pin 22a is formed with a spherical shape.

The first spring 23a is accommodated in the cavity $21a_2$. One end of the first spring 23a is communicates with the engager $22a_1$ of the probe pin, and the other end of the first spring 23a communicates with an inner surface defining the cavity $21a_2$. The inner surface may be the bottom formed at the second end $21a_3$ of the first barrel 21a. The first spring 23a elastically biases the probe pin 22a towards the opening $21a_4$. By stopping the engager $22a_1$ of the probe pin 22a by the stopper $21a_5$ as a result of engaging it with the stopper $21a_5$, the probe pin 22a is prevented from becoming dislodged from the first barrel 21a. It is thus possible for the end $22a_2$ of the probe pin to protrude from the opening $21a_4$, and for the probe pin 22a to move forward and backward in the first barrel 21a.

The damper 12a is mounted to the second end $21a_3$ of the first barrel 21a and elastically supports the first barrel 21a, and comprises the second barrel 31a, the plunger 32a, and the second spring 33a. The second barrel 31a has a cavity $31a_2$ having a bottom. The cavity $31a_2$ is formed so that the bottom is formed at a second end $31a_3$ of the second barrel 31a, and communicates with an opening $31a_4$ in a first end $31a_1$ of the second barrel 31a. A stopper $31a_5$ is disposed at the first end $31a_1$ of the second barrel 31a. The side of the second end $31a_3$ of the second barrel 31a corresponds to a socket receiver $31a_6$. The socket receiver $31a_6$ is inserted in the socket portion 4b of the probe socket 4.

The plunger 32a is disposed in the cavity $31a_2$ of the second barrel 31a, and is thinner than the opening $31a_4$. An engager $32a_1$ is formed at a base end of the plunger 32a, and is stopped by the stopper $31a_5$ as a result of engaging the stopper $31a_5$. A second spring 33a is accommodated in the cavity $31a_2$. One end of the second spring 33a communicates with the engager $32a_1$ of the plunger, and the other end of the second spring 33a communicates with an inner surface defining the cavity $31a_2$. The inner surface may be the bottom formed at the second end $31a_3$ of the second barrel 31a. The second spring 33a elastically biases the plunger 32a towards the opening $31a_4$. By stopping the engager $32a_1$ of the plunger by the stopper $31a_5$ as a result of engaging it with the stopper $31a_5$, the plunger 32a is prevented from becoming dislodged from the second barrel 31a. The forward and backward movement directions of the plunger 32a are the same as those of the probe pin 22a.

It is thus possible for an end of the plunger 32a to protrude from the opening 31a₄, and for the plunger 32a to move forward and backward in the second barrel 31a. In addition, the plunger 32a is connected to the second end 21a₃ of the first barrel 21a, so that the first barrel 21a is elastically supported by the damper 12a.

The probe pin 22a is formed of a material having a sheet resistivity that is greater than that of the material of the first barrel 21a. An example of a specific material of the probe pin 22a is a resin composition having carbon fiber portions mixed in a thermoplastic resin material. The carbon fiber portions have a thickness of 100 nm or less, and a ratio between the fiber length and the fiber thickness of 5 or more. The amount of carbon fiber portions mixed in the thermoplastic resin material is desirably 0.1 to 8 parts by weight with respect to 100 parts by weight of the thermoplastic resin material. At least one of polycarbonate, polybutylene terephthalate, polyethylene terephthalate, and polypropylene may be used for the thermoplastic resin material as matrix resin.

The first barrel 21a may be formed of, for example, a material comprising brass plated with gold, or other material having equivalent structural and resistivity properties.

The sheet resistivity of the probe pin 22a is may in the range of from $10^6$ to $10^{12}$ $\Omega/\square$ (ohms/square), and more desirably in the range of from $10^8$ to $10^{10}$ $\Omega/\square$.

Sheet resistivity of the probe pin 22a less than $10^6$ $\Omega/\square$ results in electrical charges flowing with a high current value when the probe pin 22a contacts the object to be measured, which may cause electrostatic discharge damage to the object. Sheet resistivity of the probe pin 22a greater than $10^{12}$ $\Omega/\square$ may delay the escape of the electrical charges.

As shown in FIG. 3, it may be desirable that a diameter R of the end 22a₂ of the probe pin 22a may be in the range of from 3.5 to 4 mm, and that a maximum protruding height S of the probe pin 22a from the opening 21a₄ may be in the range of from 0.15 to 0.25 mm. Since only the spherical portion of the end 22a₂ of the probe pin protrudes from the opening 21a₄, even if the probe pin 22a is pushed into the first barrel 21a, the probe pin 22a may not contact the stopper 21a₅, thereby making it possible to prevent wearing of the stopper. 21a₅. Other probe tip shapes may be used to achieve a desired contact pressure.

The spring constant of the second spring 33a is greater than the spring constant of the first spring 23a. The second spring 33a may undergo a stroke on the order of 0.3 mm when it is compressed by a load of 50 g to 60 g. In contrast, the first spring 23a may undergo a stroke on the order of 0.3 mm when it is compressed by a load of 30 g. By setting the spring constants of the springs 23a and 33a as such, the first spring 23a is more easily compressed than the second spring 33a is compressed, so that the first end 21a₁ of the first barrel 21a comes into contact with the object to be measured subsequent to the contacting of the probe pin 22a with the object, and, thereafter, the second spring 33a is further compressed in order to operate the damper 12a.

Next, the operations of the contact probes 5 and 6, and the probe socket 4 in the embodiment will be described. FIGS. 4, 5, 6, and 7 are schematic views for illustrating the operations of the probe socket 4 in the embodiment.

Figure 4:
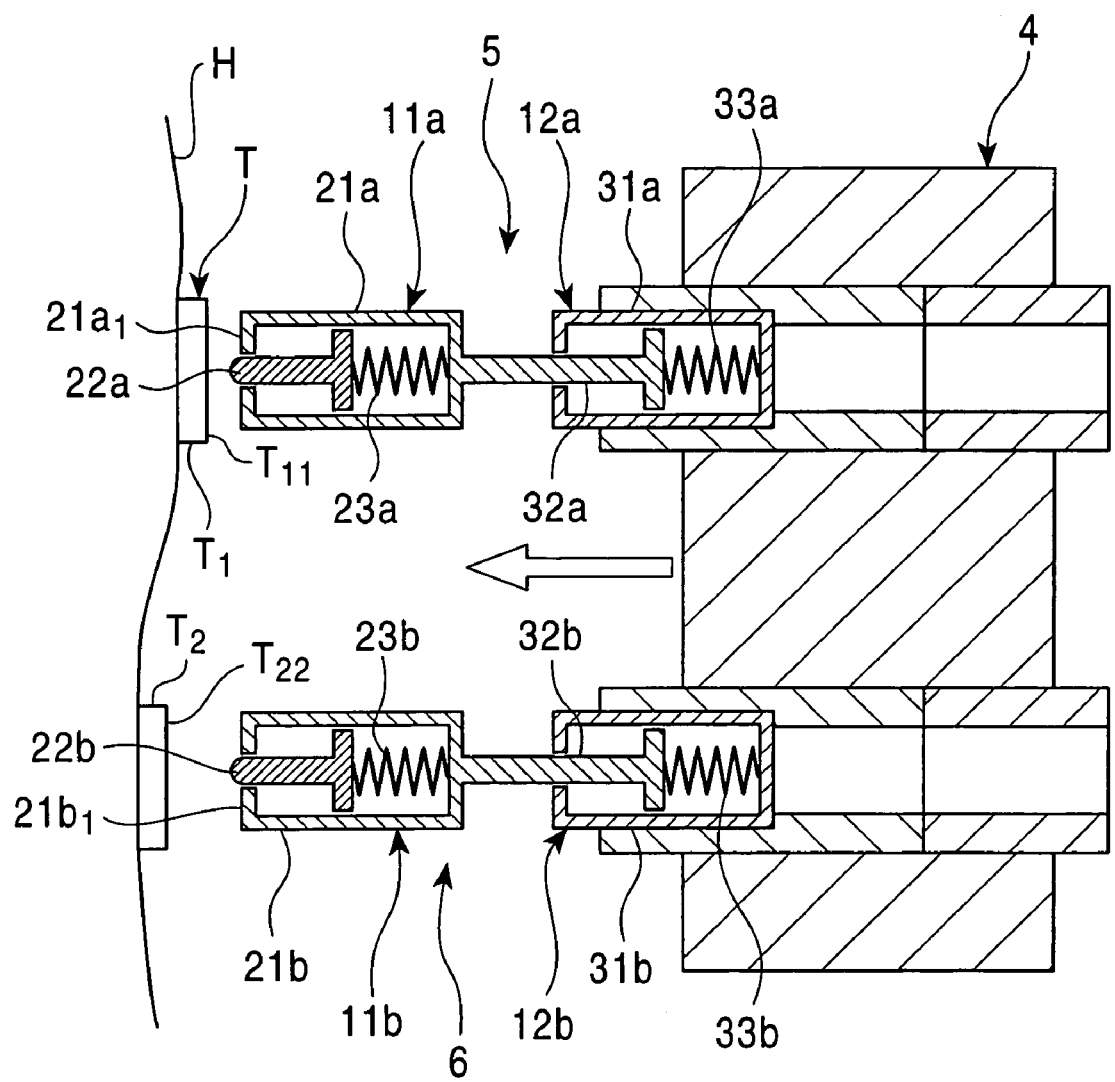
FIG. 4 is a schematic view illustrating an operation of a probe socket in the first embodiment.

First, as shown in FIG. 4, the probe socket 4 is brought closer to a terminal unit T of a thin-film magnetic head H (as an example of the object whose characteristics are to be measured). The terminal unit T of the thin-film magnetic head may have two terminals T₁ and T₂. Terminal surfaces T₁₁ and T₂₂ of the respective terminals T₁ and T₂ have different heights, due to manufacturing tolerances or design. In the example of FIG. 4, the terminal surface T₁₁ is positioned closer to the probe socket 4 than the terminal surface T₂₂.

Figure 5:
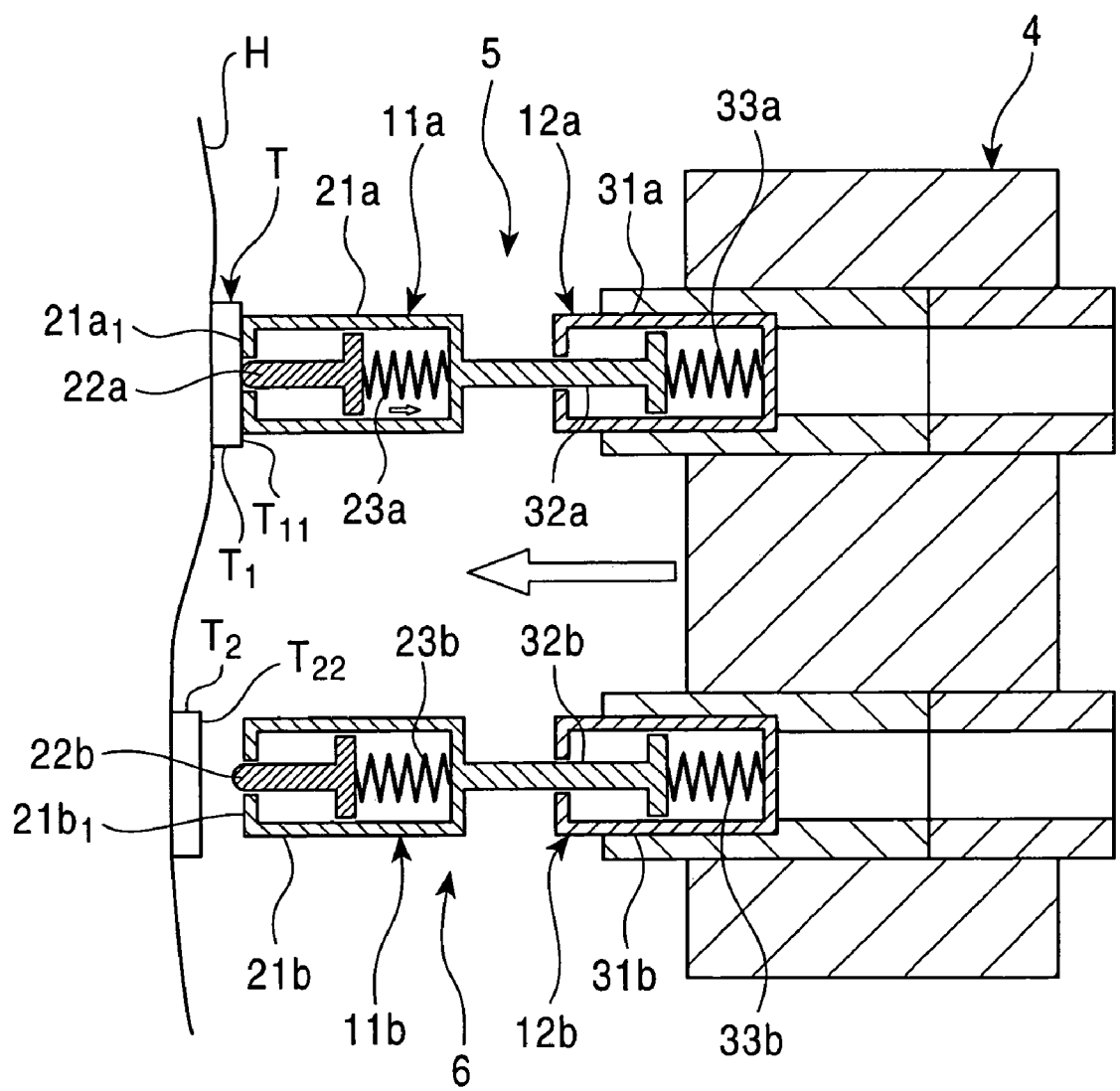
FIG. 5 is a schematic view illustrating another operation of the probe socket in the first embodiment.

As shown in FIG. 5, the probe socket 4 is brought even closer to the terminal unit T of the thin-film magnetic head H in order to bring the probe pin 22a of the contact probe 5 into contact with the terminal surface T₁₁. Here, the probe pin 22a and the terminal T₁ are brought into electrical conduction, so that electrical charges which may be present at the probe pin 22a or the terminal T₁ flow through the probe pin 22a. Since the sheet resistivity of the probe pin 22a is relatively high, the electrical current value is kept small, thereby mitigating electrostatic discharge damage to the thin-film magnetic head H.

Figure 6:
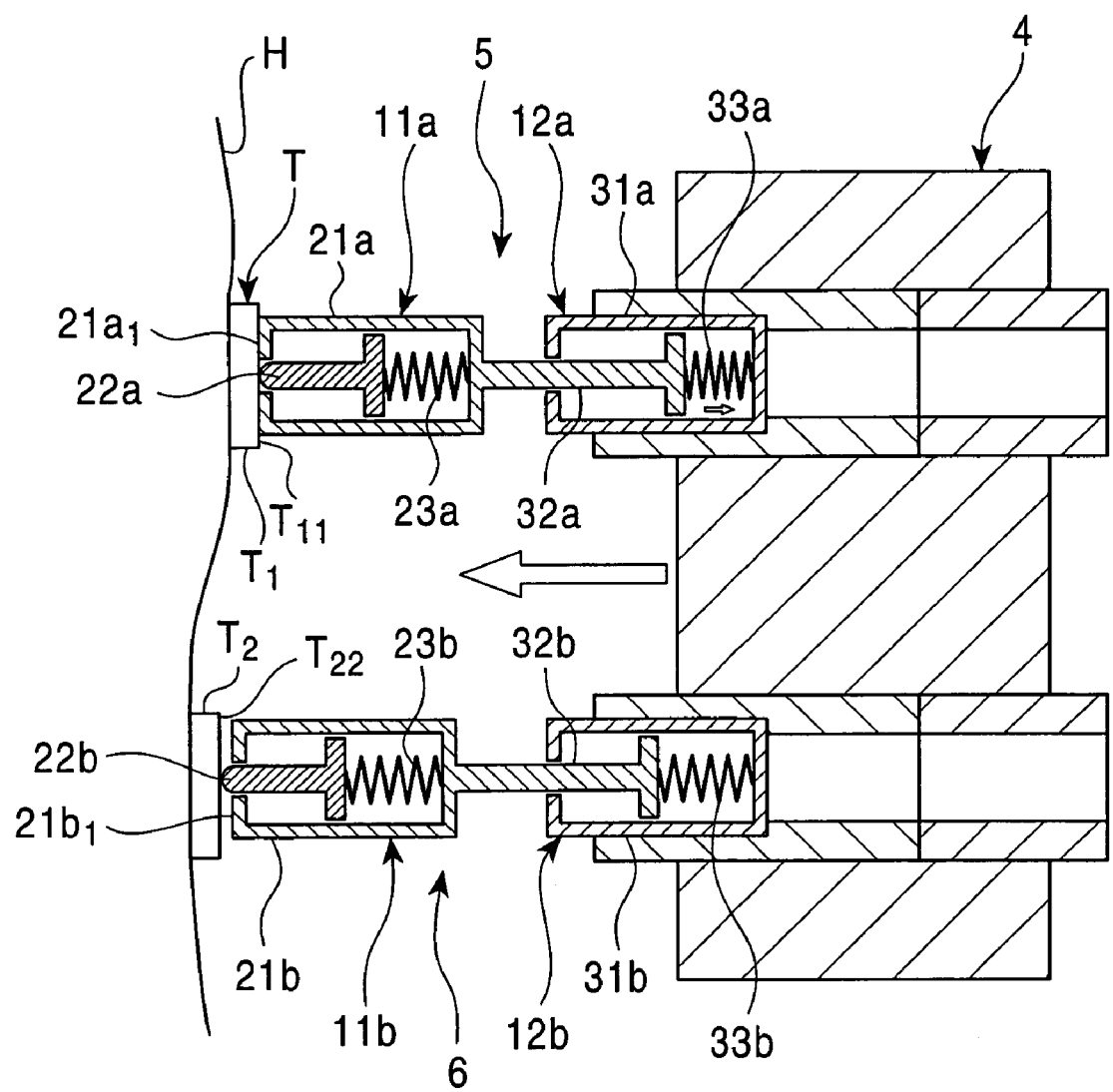
FIG. 6 is a schematic view illustrating still another operation of the probe socket in the first embodiment.

As shown in FIG. 6, the probe socket 4 is brought even closer to the terminal unit T of the thin-film magnetic head H in order to bring the probe pin 22b of the contact probe 6 into contact with the terminal surface T₂₂. At this time, in the contact probe 5, the probe pin 22a is pushed into the first barrel 21a as a result of compression of the first spring 23a when the terminal T₁ and the probe socket 4 are brought close to each other, so that the first end 21a₁ of the first barrel 21a contacts the terminal T₁. Since the spring constant of the first spring 23a is less than the spring constant of the second spring 33a, the first spring 23a is more easily compressed than the second spring 33a is compressed. The motion continues until contact between probe pin 22b and terminal T2 occurs.

Electrical conduction is achieved between the probe pin 22b and the terminal T₂, so that electrical charges which may be present at the probe pin 22b or the terminal T₂ flow through the probe pin 22b, which may mitigate electrostatic discharge damage to the thin-film magnetic head H.

Figure 7:
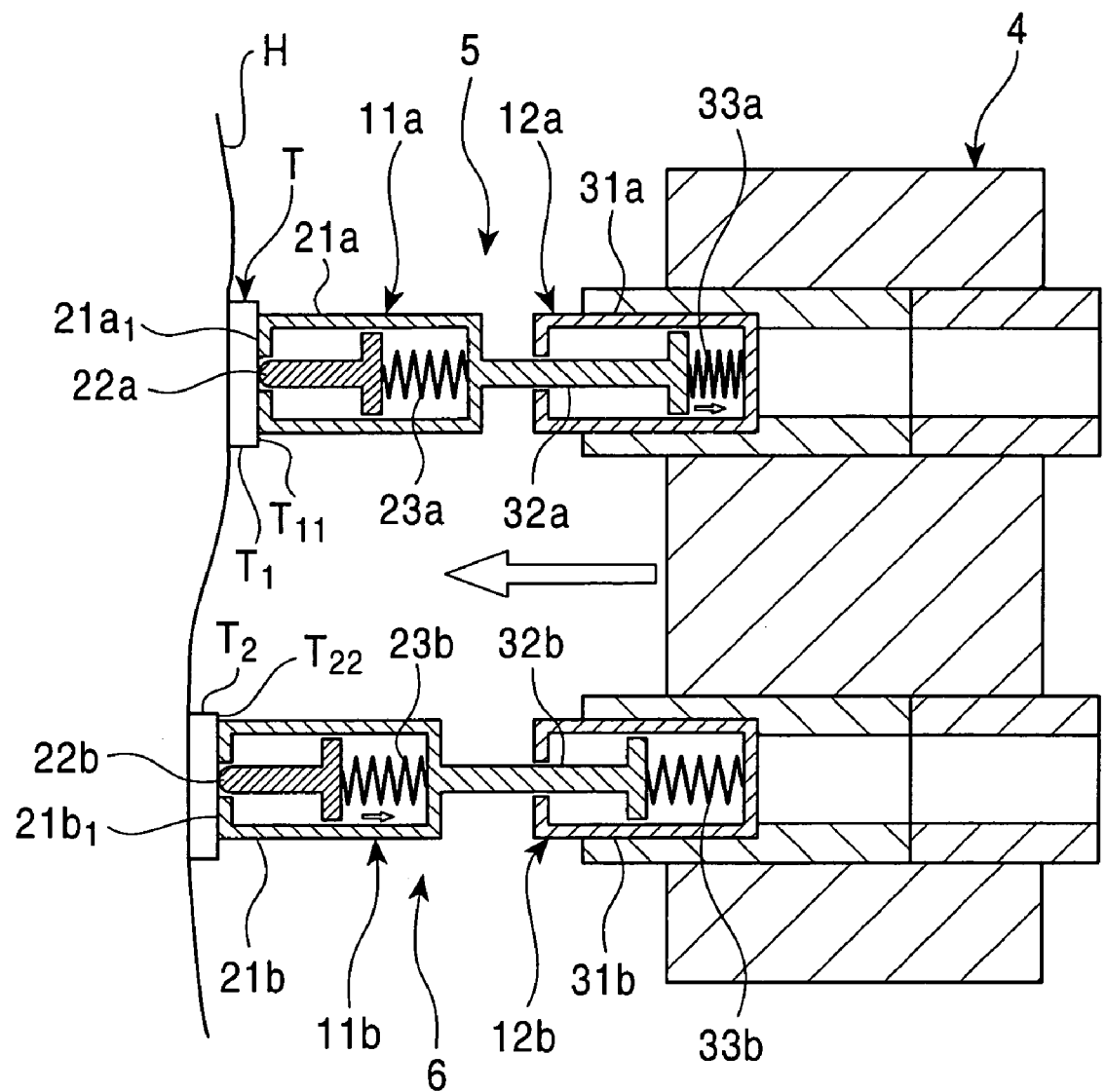
FIG. 7 is a schematic view illustrating still another operation of the probe socket in the first embodiment.

Next, as shown in FIG. 7, when the probe socket 4 continues to be brought still closer to the terminal unit T of the thin-film magnetic head H, the plunger 32a is pushed into the second barrel 31a as a result of compression of the second spring 33a of the contact probe 5, so that the contact probe 5 itself becomes shorter. At the same time, the first spring 23b of the contact probe 6 is compressed, so that the first end 21b₁ of the first barrel 21b comes into contact with the terminal surface T₂₂. Accordingly, the first barrels 21a and 21b of the respective contact probes 5 and 6 contact the terminals T₁ and T₂, respectively. Since the first barrels 21a and 21b are formed of materials having relatively small sheet resistivity, voltage drops between the terminal unit T and the contact probes 5 and 6 are reduced.

When the terminal surfaces T₁₁ and T₂₂ are not aligned, and the first barrel 21a of the contact probe 5 is only in contact with the terminal surface T₁₁ (so that the first barrel 21b of the contact probe 6 is not in contact with the terminal surface T₂₂), by further pushing the probe socket 4 against the thin-film magnetic head H, the damper 12a of the contact probe 5 is operated to reduce the overall length of the contact probe 5 itself. By this, the first spring 23b of the contact probe 6 is compressed, so that the first barrel 21b can be brought into contact with the terminal surface T₂₂. Therefore, it is possible to bring the first ends 21a₁ and 21b₁ of the first barrels into contact with the terminals T₁ and T₂, so that electrical characteristics can be measured precisely.

Since, as the probe socket 4 is moved closer to the terminal unit T of the thin-film magnetic head H, the plunger 32a is pushed into the second barrel 31a as a result of compression of the second spring 33a of the contact probe 5, it is possible to reduce contact pressure between the first barrel 21a of the contact probe 5 and the terminal surface $T_{11}$, so that the terminal surface $T_{11}$ will not get scratched by the first barrel 21a.

Since, as described above, the first spring 23a is more easily compressed than the second spring 33a is compressed when the contact probe 5 is pushed against the terminal unit T, it is possible to reliably contact the first barrel 21a with the terminal surface $T_{11}$, so that electrical characteristics can be measured smoothly.

Figure 8:
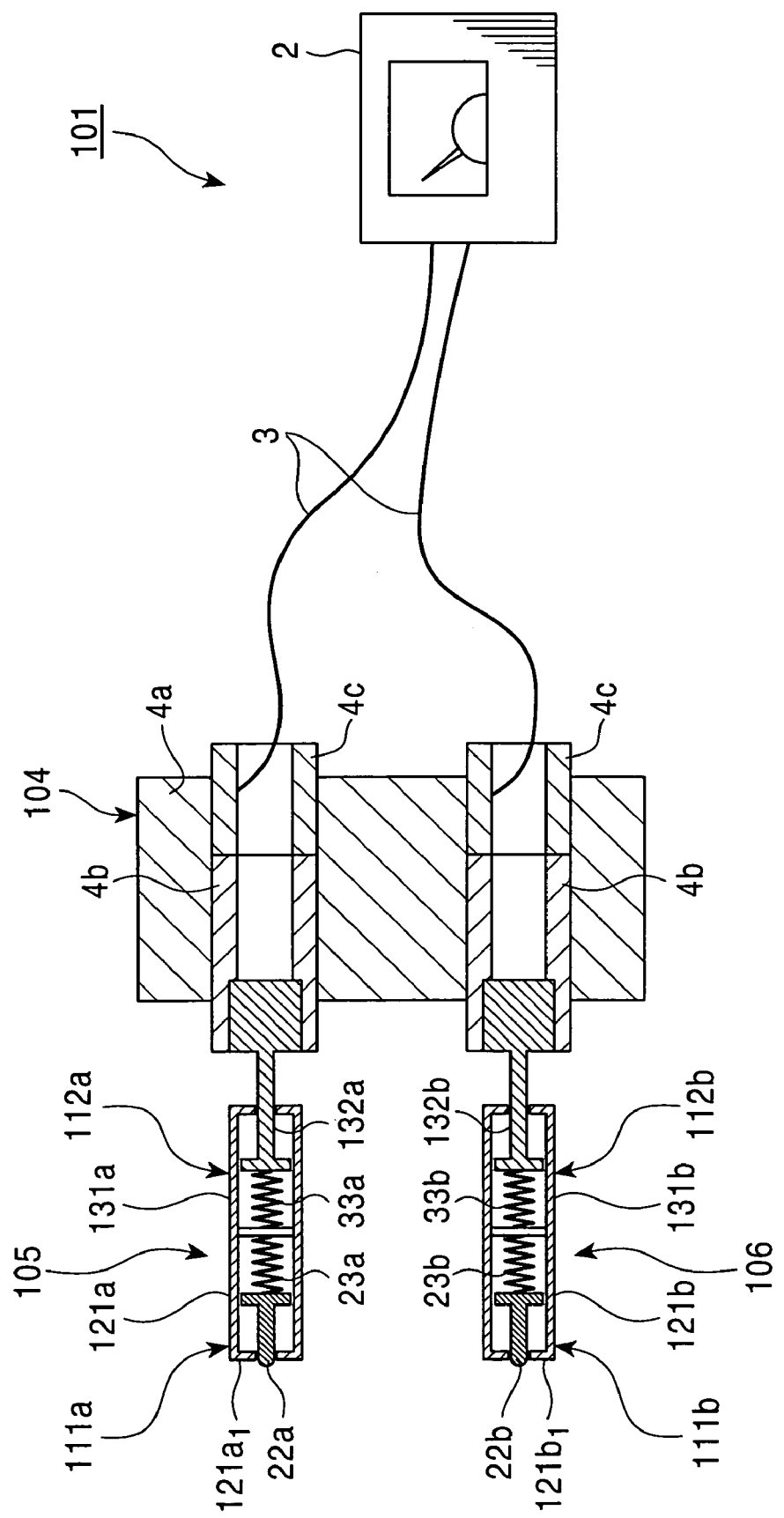
FIG. 8 is a schematic view of the structure of an electrical characteristic measuring device of a second embodiment.
Figure 9:
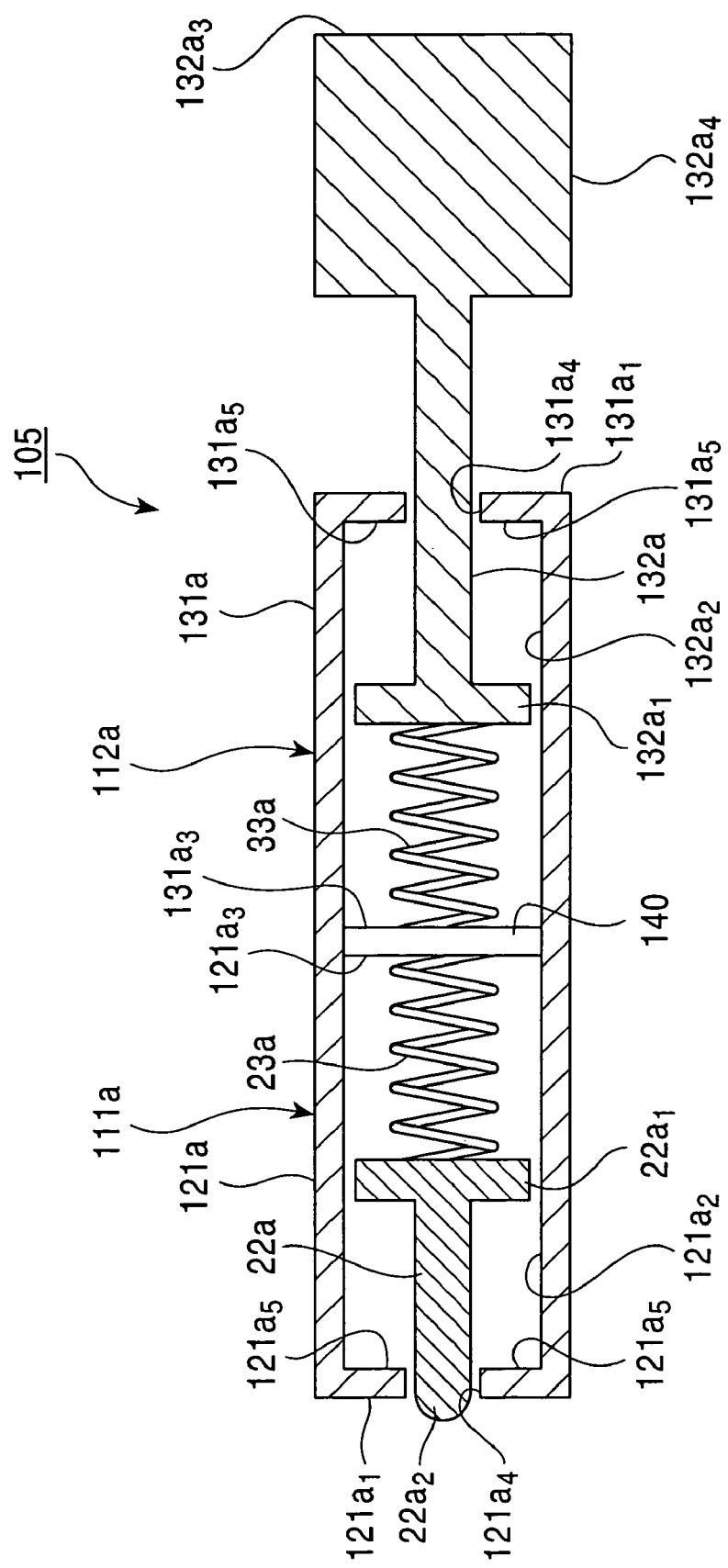
FIG. 9 is a sectional schematic view of the structure of a contact probe of the electrical characteristic measuring device of the second embodiment.

A second embodiment of the present invention will be described with reference to the relevant drawings. FIG. 8 shows the structure of an electrical characteristic measuring device of the second embodiment. FIG. 9 shows the structure of a contact probe of the electrical characteristic measuring device shown in FIG. 8. Corresponding parts of the electrical characteristic measuring device, a contact socket, and the contact probe to those of the electrical characteristic measuring device, the contact socket, and the contact probe having equivalent functions in the first embodiment are given the same reference numerals. Descriptions thereof will be either omitted or simplified.

As shown in FIG. 8, an electrical characteristic measuring device 101 comprises a body 2, a measurement cable 3, and a probe socket 104. In the example shown in FIG. 8, the probe socket 104 has two contact probes 105 and 106.

The contact probes 105 and 106 have equivalent structures, so that the contact probe 105 is only shown in FIG. 9. As shown in FIGS. 8 and 9, the contact probes 105 and 106 comprise probe tips 111a and 111b and dampers 112a and 112b, respectively. The probe tips 11a and 111b comprise, respectively, first barrels 121a and 121b, probe pins 22a and 22b movable forward and backward in the respective first barrels 121a and 121b, and first springs 23a and 23b for elastically biasing the respective probe pins 22a and 22b. The dampers 112a and 112b comprise, respectively, second barrels 131a and 131b, plungers 132a and 132b movable forward and backward in the respective second barrels 131a and 131b, and second springs 33a and 33b for elastically biasing the respective plungers 132a and 132b.

As shown in FIG. 8, the probe socket 104 comprises the two contact probes 105 and 106 and a body 4a for holding the contact probes 105 and 106. The body 4a has two socket portions 4b and 4b in which the plungers 132a and 132b of the respective contact probes 105 and 106 are inserted. Probe terminals 4c and 4c are connected to the respective socket portions 4b and 4b, and the contact probes 105 and 106 are connected to the respective measurement cables 3 and 3 through the respective probe terminals 4c and 4c.

The contact probes 105 and 106 are aligned so that the forward and backward movement directions of the probe pin 22a and those of the probe pin 22b are the same with respect to the body 4a, and so that first ends $121a_1$ and $121b_1$ of the respective first barrels 121a and 121b are aligned with respect to the body 4a.

As shown in FIG. 9, the probe tip 111a comprises the first barrel 121a, the probe pin 22a, and the first spring 23a. The first barrel 121a has a cavity $121a_2$ having a bottom. The cavity $121a_2$ is formed so that the bottom is comprised of a partition 140 formed at a second end $121a_3$ of the first barrel 121a, and communicates with an opening $121a_4$ at the first end $121a_1$ of the first barrel. A stopper $121a_5$ is disposed at the first end $121a_1$ of the first barrel 121a.

The probe pin 22a is disposed in the cavity $121a_2$ of the first barrel 121a. An engager $22a_1$ is formed at a base end of the probe pin 22a, and is stopped by the stopper $121a_5$ as a result of engaging the stopper $121a_5$.

The first spring 23a is disposed in the cavity $121a_2$. One end of the first spring 23a communicates with the engager $22a_1$ of the probe pin, and the other end of the first spring 23a communicates with the partition 140. The first spring 23a elastically biases the probe pin 22a towards the opening $121a_4$. By virtue of the structure, it is possible for an end $22a_2$ of the probe pin to protrude from the opening $121a_4$, and for the probe pin 22a to move forward and backward in the first barrel 121a.

The damper 112a is mounted to the second end $121a_3$ of the first barrel 121a and elastically supports the first barrel 121a, and comprises the second barrel 131a, the plunger 132a, and the second spring 33a. The second barrel 131a has a cavity $131a_2$ having a bottom. The cavity $131a_2$ is formed so that the bottom is formed at a second end $131a_3$ of the second barrel 131a, and communicates with an opening $131a_4$ in a first end $131a_1$ of the second barrel 131a. The cavities $121a_2$ and $131a_2$ of the respective first barrel 121a and the second barrel 131a are divided by the partition 140.

A stopper $131a_5$ is disposed at the first end $131a_1$ of the second barrel 131a. The side of an end $132a_3$ of the plunger 132a corresponds to a socket receiver $132a_4$. The socket receiver $132a_4$ is inserted in the socket portion 4b of the probe socket 104.

The plunger 132a is disposed in the cavity $131a_2$ of the second barrel 131a. An engager $132a_1$ is formed at a base end of the plunger 132a, and is stopped by the stopper $131a_5$ as a result of engaging the stopper $131a_5$. The second spring 33a is disposed in the cavity $131a_2$. One end of the second spring 33a communicates with the engager $132a_1$ of the plunger, and the other end of the second spring 33a communicates with the partition 140. The second spring 33a elastically biases the plunger 132a towards the opening $131a_4$. By stopping the engager $132a_1$ of the plunger by the stopper $131a_5$ as a result of engaging it with the stopper $131a_5$, the plunger 132a is prevented from becoming dislodged from the second barrel 131a.

By virtue of the structure, it is possible for the end $132a_3$ of the plunger 132a to protrude from the opening $131a_4$, and for the plunger 132a to move forward and backward in the second barrel 131a. In addition, the second barrel 131a is connected to the first barrel 121a, so that the first barrel 121a is elastically supported by the damper 112a.

As in the first embodiment, the probe pin 22a may be formed of a material having a sheet resistivity that is greater than that of the material of the first barrel 121a. The first barrel 121a may be formed of the same material as the first barrel 21a in the first embodiment.

A diameter R of the end $22a_2$ of the probe pin 22a, and a maximum protruding height S of the probe pin 22a may be set at values as indicated in the first embodiment. By virtue of the structure, it possible to prevent wearing of the stopper $121a_5$ caused by the probe pin 22a.

The spring constant of the second spring 33a and the spring constant of the first spring 23a may be set at values as indicated in the first embodiment. The first spring 23a is more easily compressed than the second spring 33a is compressed, so that the first end $121a_1$ of the first barrel 121a comes into contact with an object to be measured subsequent to the contacting of the probe pin 22a with the object, and, thereafter, the second spring 33a is compressed in order to operate the damper 112a.

Next, the operations of the contact probes 105 and 106, and the probe socket 104 in the embodiment will be described. FIGS. 10, 11, 12, and 13 are schematic views for illustrating the operations of the probe socket 104 in the embodiment.

Figure 10:
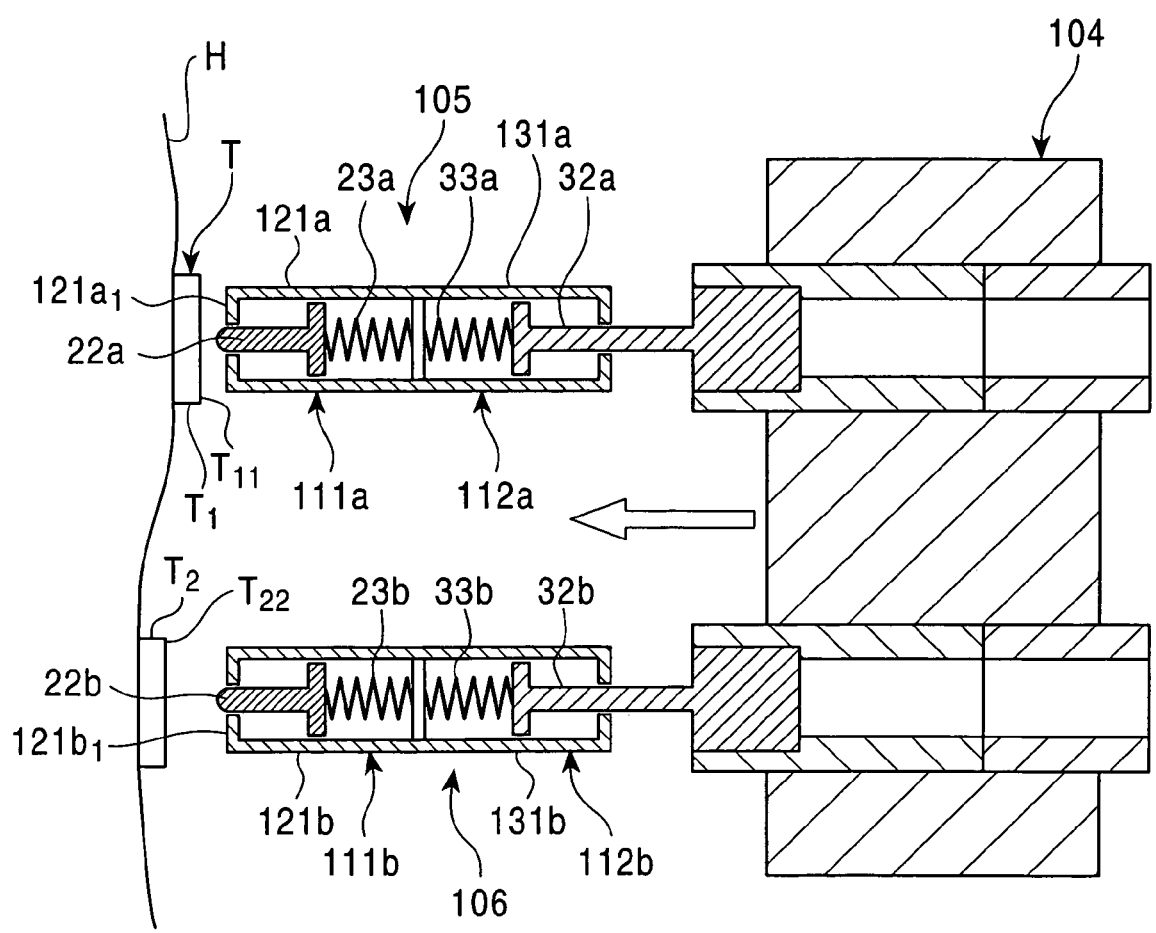
FIG. 10 is a schematic view illustrating an operation of a probe socket in the second embodiment.
Figure 11:
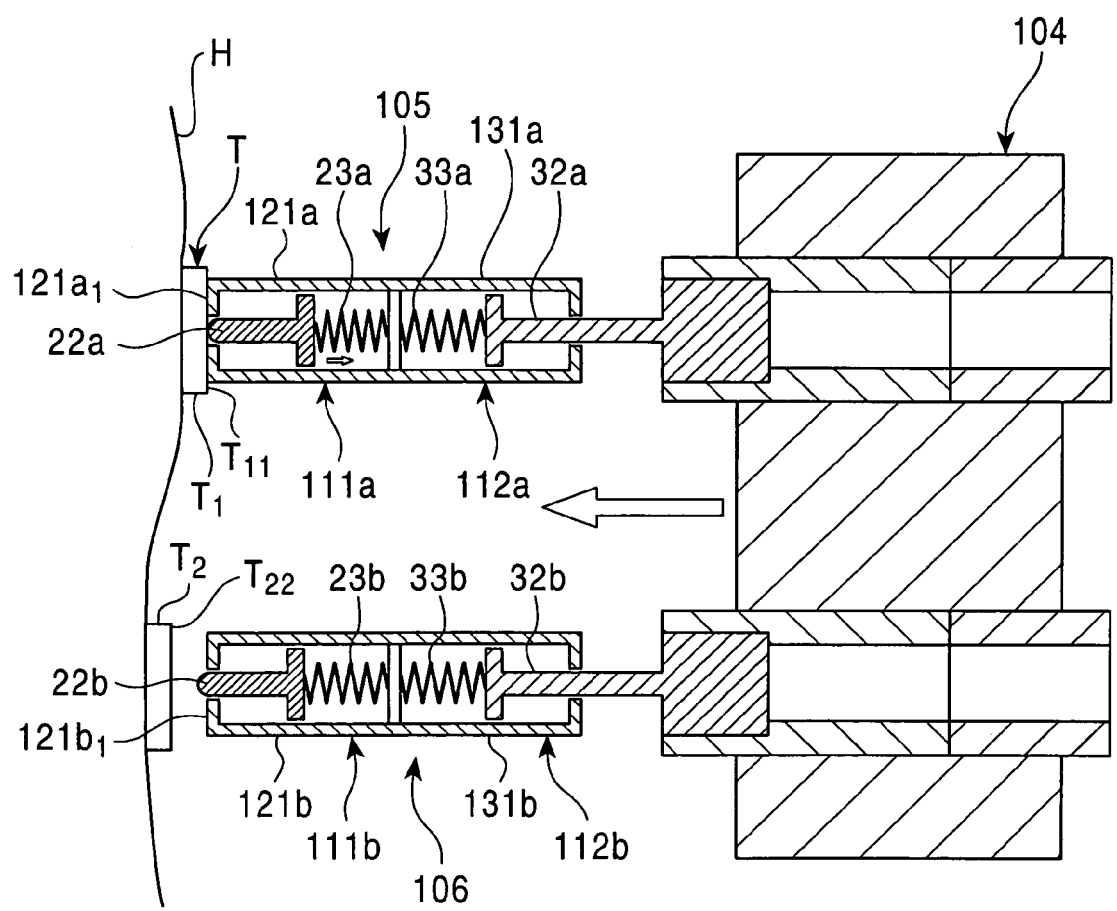
FIG. 11 is a schematic view illustrating another operation of the probe socket in the second embodiment.

First, as shown in FIG. 10, the probe socket 104 is brought closer to a terminal unit T of a thin-film magnetic head H (as an example of an object whose characteristics are to be measured). Next, as shown in FIG. 11, the probe socket 104 is brought even closer to the terminal unit T of the thin-film magnetic head H in order to bring the probe pin 22a of the contact probe 105 into contact with a terminal surface $T_{11}$. The probe pin 22a and the terminal $T_1$ are then brought into electrical contact, so that electrical charges which may be present at the probe pin 22a or the terminal $T_1$ flow through the probe pin 22a. Since the sheet resistivity of the probe pin 22a is relatively high, the electrical current value is kept small, thereby mitigating electrostatic discharge damage to the thin-film magnetic head H.

Figure 12:
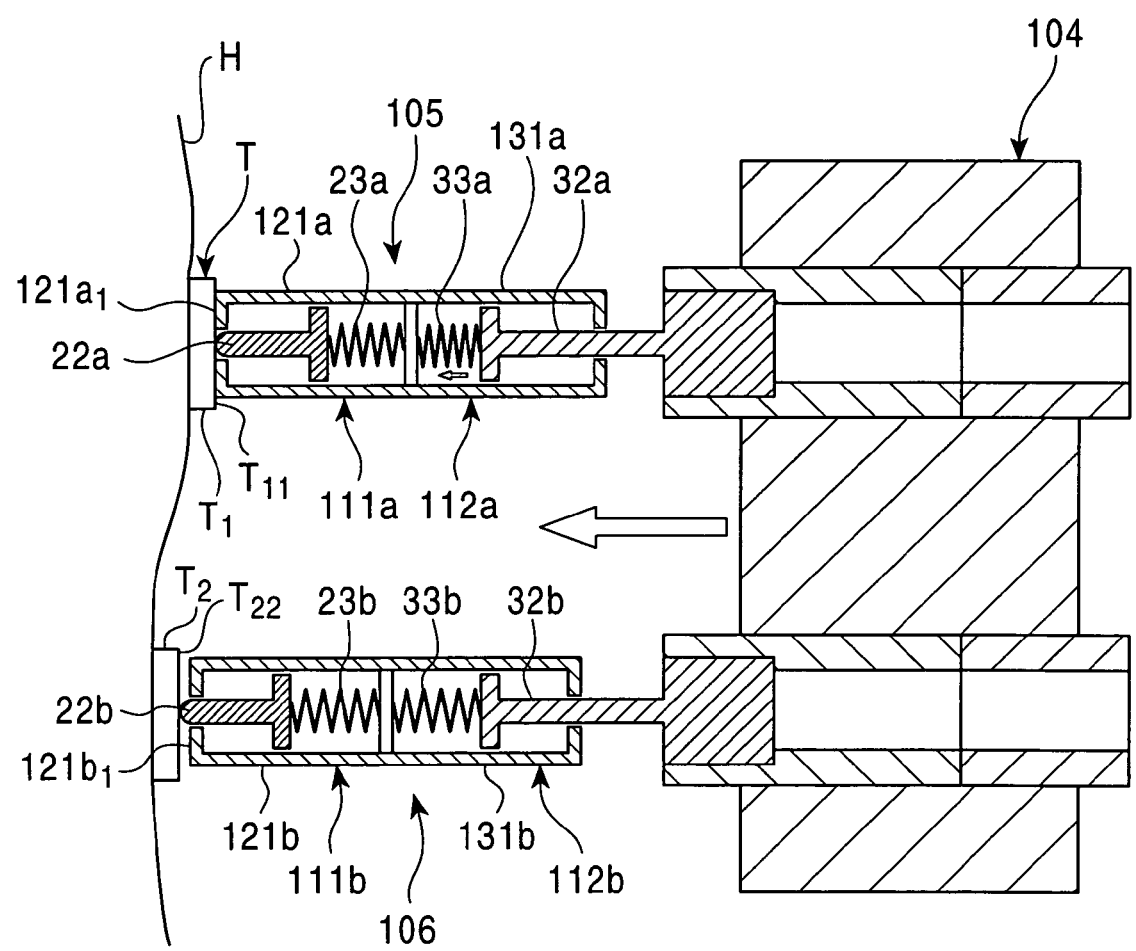
FIG. 12 is a schematic view illustrating still another operation of the probe socket in the second embodiment.

Next, as shown in FIG. 12, the probe socket 104 is brought even closer to the terminal unit T of the thin-film magnetic head H in order to bring the probe pin 22b of the contact probe 106 into contact with a terminal surface $T_{22}$. At this time, in the contact probe 105, the probe pin 22a is pushed into the first barrel 121a as a result of compression of the first spring 23a when the terminal unit T and the probe socket 104 are brought close to each other, so that the first end $121a_1$ of the first barrel 21a contacts the terminal $T_1$. Since the spring constant of the first spring 23a is less than the spring constant of the second spring 33a, the first spring 23a is more easily compressed than the second spring 33a is compressed.

Electrical conduction is achieved between the probe pin 22b and the terminal $T_2$, so that electrical charges which may be present at the probe pin 22b or the terminal $T_2$ flow through the probe pin 22b, thereby mitigating electrostatic discharge damage to the thin-film magnetic head H.

Figure 13:
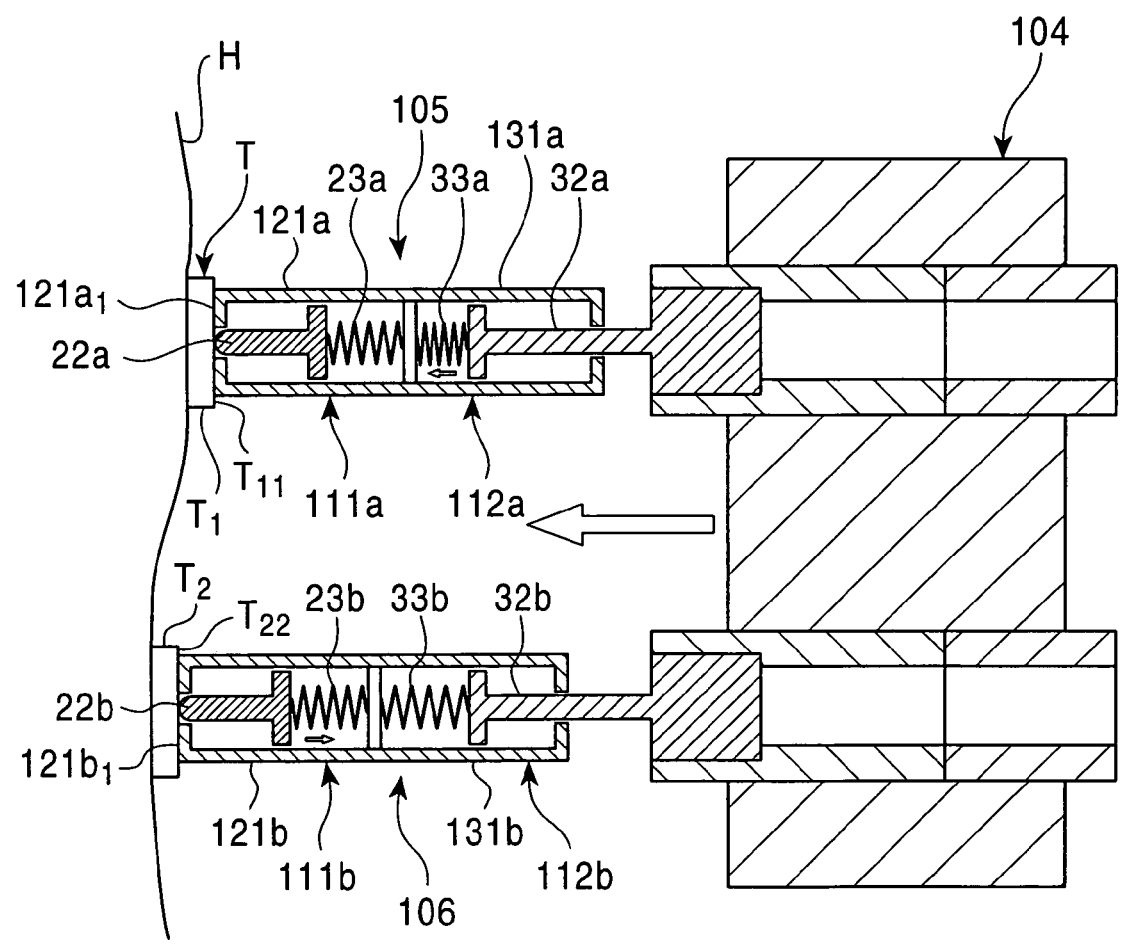
FIG. 13 is a schematic view illustrating still another operation of the probe socket in the second embodiment.
Figure 14:
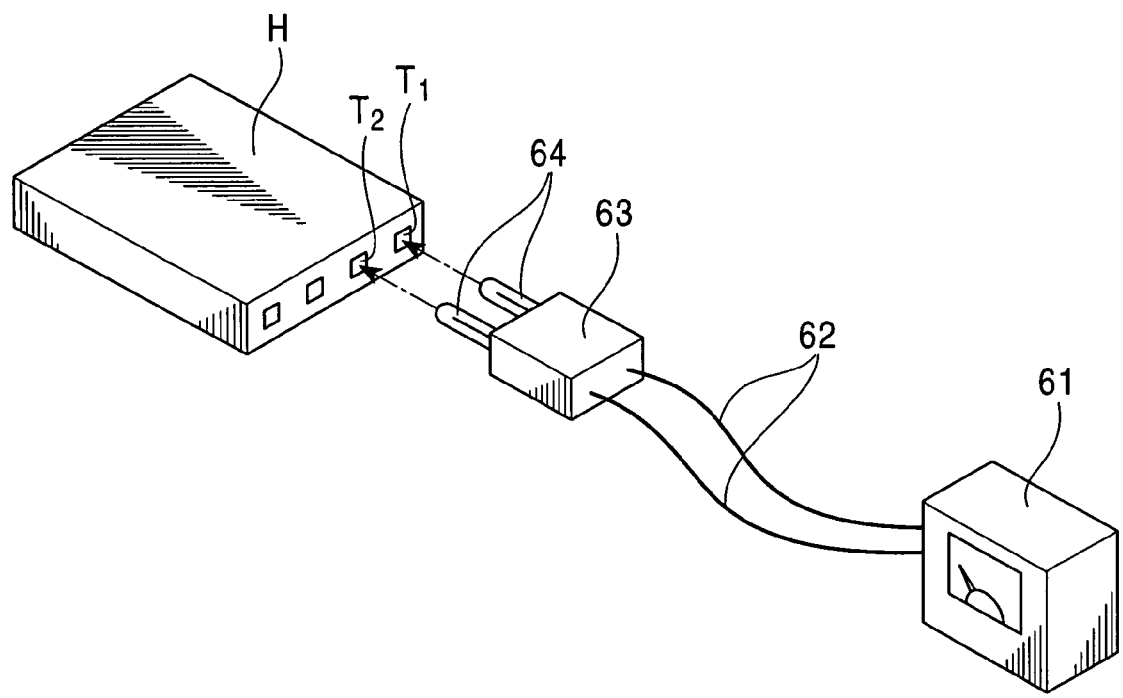
FIG. 14 is a schematic view of the structure of a related electrical characteristic measuring device.
Figure 15:
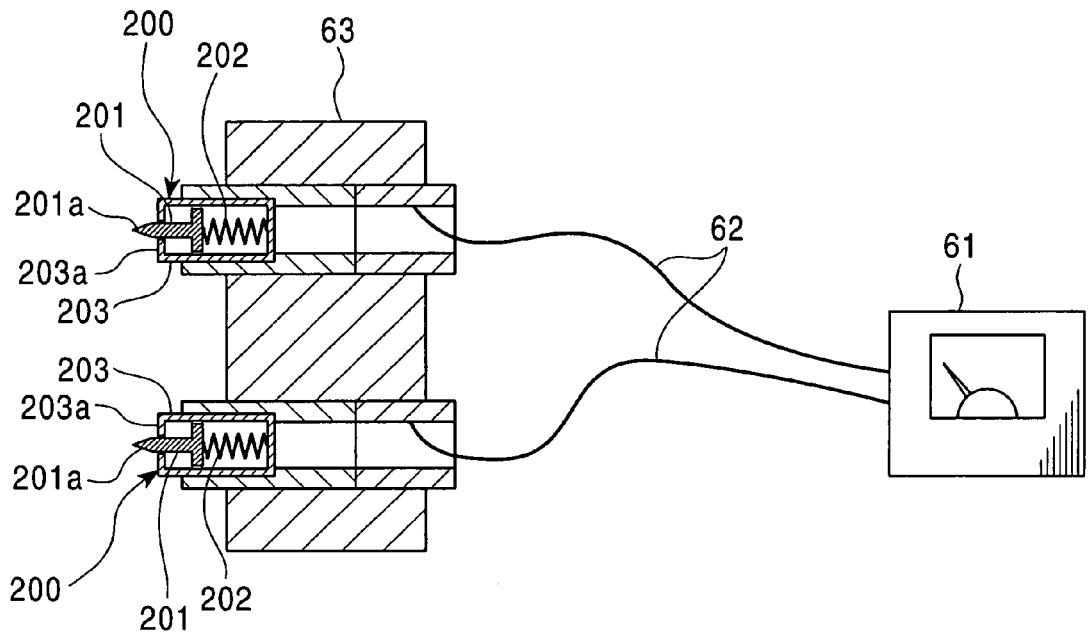
FIG. 15 is a schematic view of the structure of a related electrical characteristic measuring device.
Figure 16:
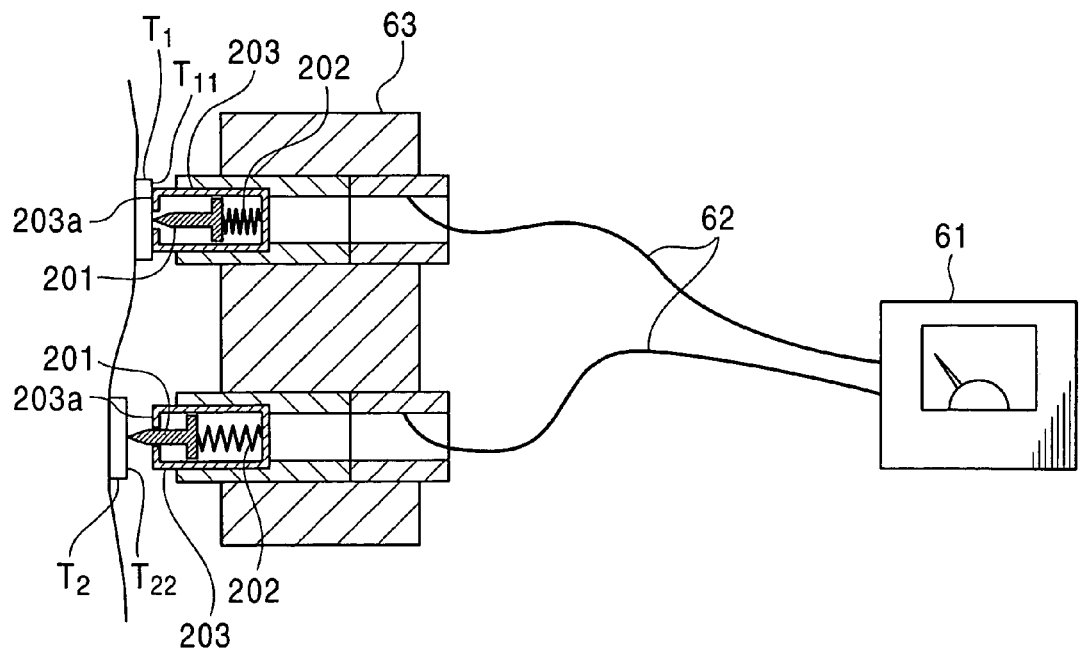
FIG. 16 is a schematic view illustrating the operation of the related electrical characteristic measuring device.

Next, as shown in FIG. 13, when the probe socket 104 is brought even closer to the terminal unit T of the thin-film magnetic head H, the plunger 132a is pushed into the second barrel 131a as a result of compression of the second spring 33a of the contact probe 105, so that the contact probe 105 itself becomes shorter. At the same time, the first spring 23b of the contact probe 106 is compressed, so that the first end $121b_1$ of the first barrel 121b comes into contact with the terminal surface $T_{22}$. Accordingly, the first barrels 121a and 121b of the respective contact probes 105 and 1.06 contact the terminals $T_1$ and $T_2$, respectively. Since the first barrels 121a and 121b are formed of materials having relatively small sheet resistivity, voltage drops between the terminal unit T and the contact probes 105 and 106 are reduced.

When the terminal surfaces $T_{11}$ and $T_{22}$ are not aligned, and the first barrel 121a of the contact probe 105 is only in contact with the terminal surface $T_{11}$ (so that the first barrel 121b of the contact probe 106 is not in contact with the terminal surface $T_{22}$), by further pushing the probe socket 104 against the thin-film magnetic head H, the damper 112a of the contact probe 105 is operated to reduce the overall length of the contact probe 105 itself. By this, the first spring 23b of the contact probe 106 is compressed, so that the first barrel 121b can be brought into contact with the terminal surface $T_{22}$. Therefore, it is possible to bring the first ends $121a_1$ and $121b_1$ of the first barrels 121a and 121b into contact with the terminals $T_1$ and $T_2$, so that electrical characteristics can be measured.

Since, as the probe socket 104 is moved closer to the terminal unit T of the thin-film magnetic head H, the plunger 132a is pushed into the second barrel 131a as a result of compression of the second spring 33a of the contact probe 105, it is possible to reduce contact pressure between the first barrel 121a of the contact probe 105 and the terminal surface $T_{11}$, so that the terminal surface $T_{11}$ will may not be scratched by the first barrel 121a.

Since, as described above, the first spring 23a is more easily compressed than the second spring 33a is compressed when the contact probe 105 is pushed against the terminal unit T, it is possible to reliably contact the first barrel 121a with the terminal surface $T_{11}$, so that electrical characteristics can be measured smoothly.

The scope of the present invention is not limited to the above-described embodiments, so that various modifications may be made within the scope of the present invention. For example, although, in each of the above-described embodiments, a probe socket having two contact probes is explained, a contact socket having three or more contact probes may also be used in the present invention.

Although the description of the contact probe has been described in the context where a fist probe contacts a first corresponding terminal prior to a second probe contacting a second corresponding terminal due to a linear offset in the distances to be traversed between the probes and the terminals, such a situation may also result from an angular offset of the probe socket from the surface to which the terminals are mounted, or a combination of the two situations.

As can be further understood from the foregoing description, in the contact probe in the present invention, a damper elastically supporting the first barrel is mounted to the second end of the first barrel of the probe tip, so that contact pressure produced when the first end of the first barrel contacts an object to be measured is reduced by the damper, as a result of which the object may not be scratched.

What is claimed is:

1. A contact probe comprising:
    a probe tip comprising a first barrel, a probe pin, and a first spring; and
    a damper;
    wherein the first barrel has a cavity with a bottom, an opening being disposed in a first end of the first barrel and the bottom being disposed at a second end of the first barrel;
    the probe pin is movable forward and backward in the cavity
    the first spring, mounted in the cavity, elastically biases the probe pin towards the opening;
    the damper is mounted to the second end of the first barrel, and elastically supports the first barrel;
    the damper comprises a second barrel, a plunger, and a second spring; the second barrel has a cavity with a second bottom, an opening is disposed in a first end of the second barrel and the second bottom is disposed at a second end of the second barrel; the plunger is mounted in the second barrel so as to be movable forward and backward; the second spring is mounted in the second barrel for elastically biasing the plunger towards the opening of the second barrel, and the plunger is connected to the second end of the first barrel.

2. The contact probe according to claim 1, wherein the spring constant of the second spring is greater than the spring constant of the first spring.

3. The contact probe according to claim 1, wherein the ratio of the spring constant of the second spring to the spring constant of the first spring is approximately 2.

4. The contact probe according to claim 1, wherein a sheet resistivity of the probe pin is greater than a sheet resistivity of the first barrel.

5. The contact probe according to claim 1, wherein a sheet resistivity of the probe pin is approximately $10^6$ to approximately $10^{12}$ $\Omega/\square$ (ohms/square).

6. The contact probe according to claim 5, wherein a sheet resistivity of the probe pin is approximately $10^8$ to approximately $10^{10}$ $\Omega/\square$ (ohms/square).

7. The contact probe according to claim 1, wherein a sheet resistivity of the first barrel is substantially equal to that of a metal.

8. The contact probe according to claim 1, wherein the probe tip comprises a composite material.

9. The contact probe according to claim 8, wherein the composite material comprises fiber portions embedded in a resin material.

10. The contact probe according to claim 9, wherein the fiber portions comprise carbon fiber.

11. The contact probe according to claim 10, wherein the carbon fiber has a thickness of 100 nm or less and a ratio of fiber length to fiber thickness of approximately 5 or greater.

12. The contact probe according to claim 10, wherein the fiber portions comprise approximately 0.1 to approximately 8 parts by weight with respect to 100 parts by weight of the resin material.

13. The contact probe according to claim 9, wherein the resin material is a thermoplastic material.

14. The contact probe according to claim 13, wherein the thermoplastic material is at least one selected from the group of: polycarbonate, polybutylene therephthalate, polypropylene therephthalate and polypropelene.

15. The contact probe according to claim 1, wherein the first barrel comprises brass.

16. The contact probe according to claim 12, wherein the first barrel is plated with gold.

17. The contact probe according to claim 1, wherein an end of the probe pin is spherical.

18. The contact probe according to claim 17, wherein a diameter of the spherical end of the probe tip is approximately 3.5 mm to approximately 4 mm.

19. The contact probe according to claim 1, wherein the spherical end of the probe tip protrudes from an opening in the first barrel by not greater than approximately 0.15 mm to approximately 0.25 mm.

* * * * *